United States Patent [19]

Bynum et al.

[11] Patent Number: 4,581,547

[45] Date of Patent: Apr. 8, 1986

[54] INTEGRATED CIRCUIT THAT ELIMINATES LATCH-UP AND ANALOG SIGNAL ERROR DUE TO CURRENT INJECTED FROM THE SUBSTRATE

[75] Inventors: Byron G. Bynum; David L. Cave, both of Tempe, Ariz.

[73] Assignee: Motorola, Inc., Schaumburg, Ill.

[21] Appl. No.: 582,356

[22] Filed: Feb. 22, 1984

[51] Int. Cl.$^4$ .................. H01L 29/72; H03K 3/26
[52] U.S. Cl. .................. 307/299 A; 307/296 R; 330/288; 330/300; 357/35; 357/44; 357/48; 357/34
[58] Field of Search .............. 357/34, 35, 44, 48; 307/296 R, 299 A; 330/288, 300

[56] References Cited

U.S. PATENT DOCUMENTS

| | | | |
|---|---|---|---|
| 3,596,115 | 7/1971 | Conzelmann | 357/44 |
| 3,821,784 | 6/1974 | Heald | 357/34 |
| 4,024,417 | 5/1977 | Hueber et al. | 357/48 |
| 4,147,992 | 4/1979 | Davis | 330/288 |
| 4,345,166 | 8/1982 | Allen et al. | 307/296 R |

Primary Examiner—Andrew J. James
Assistant Examiner—Jerome Jackson
Attorney, Agent, or Firm—William E. Koch

[57] ABSTRACT

A method is disclosed for eliminating latch-up and analog signal errors in power circuits having a vertical output transistor structure wherein a P-type chip substrate serves as a collector of a saturating vertical PNP transistor. When the P-type substrate rises to $V_{CC}$, current is injected into N-type epitaxial layer regions which may then be collected by P-type regions diffused in the epitaxial regions. Circuit problems due to these parasitic currents are avoided by providing dominantly negative feedback for potential latch mechanisms triggered by the injected currents, and providing balancing means to cancel the effects of the injected currents in analog signal paths.

6 Claims, 4 Drawing Figures

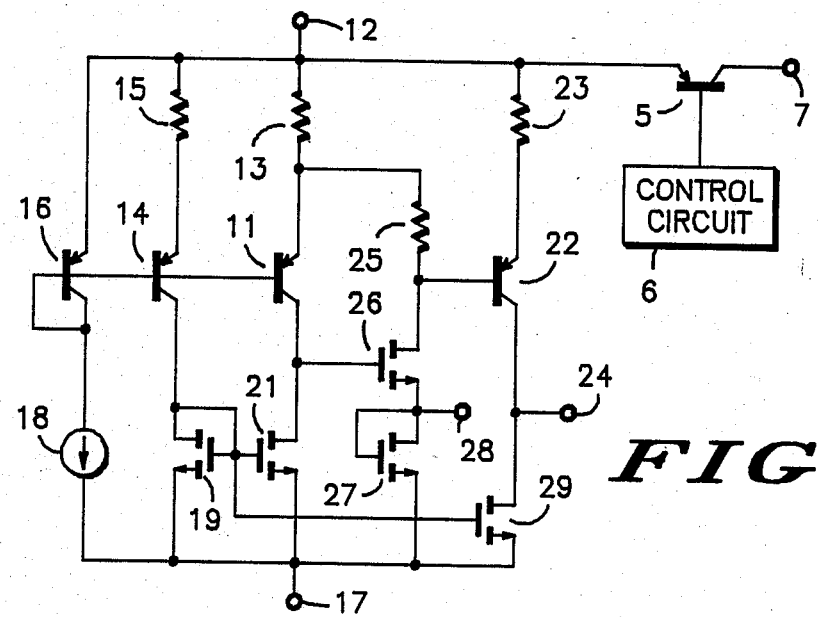
*FIG. 1*
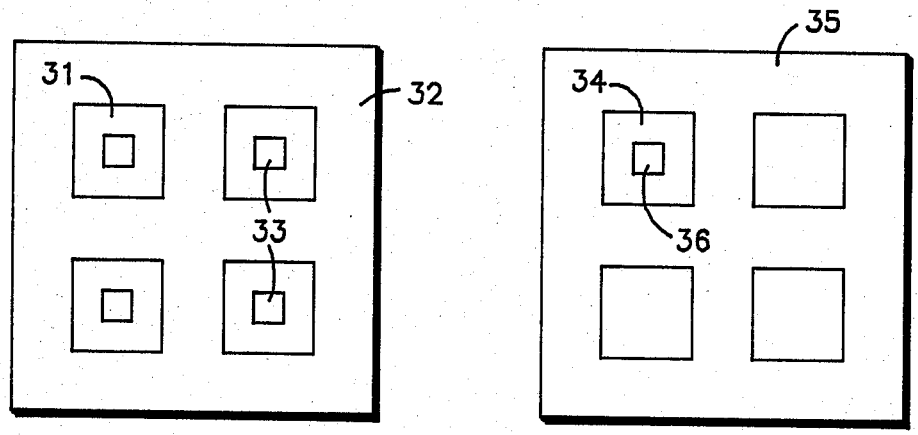
*FIG.2* *FIG.3*
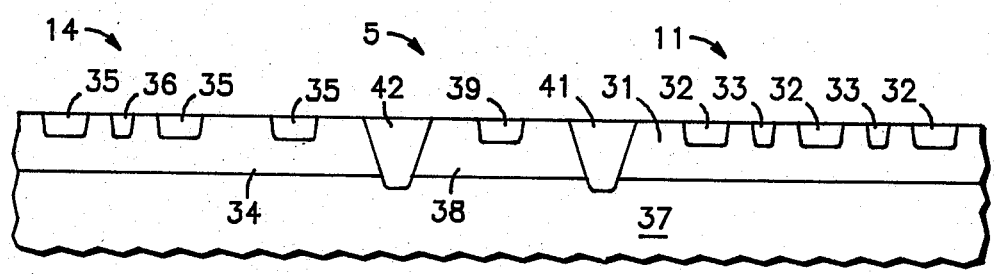
*FIG.4*

INTEGRATED CIRCUIT THAT ELIMINATES LATCH-UP AND ANALOG SIGNAL ERROR DUE TO CURRENT INJECTED FROM THE SUBSTRATE

BACKGROUND OF THE INVENTION

1. Field of the Invention

This invention relates generally to power integrated circuits having saturating vertical output transistor configurations and, more specifically, to a method of eliminating latch-up and analog signal errors in circuits wherein the chip substrate injects current into an epitaxial layer.

2. Background Art

Recent advances in semiconductor technology includes integrated circuitry having vertical PNP output power transistors. The typical configuration comprises a P-type chip substrate, which also serves as a collector for the PNP output power transistor. An N-type epitaxial layer overlies the P-substrate and serves as a base for the PNP output power transistor as well as for lateral PNP transistors. A plurality of P-regions may be diffused into the N-type epitaxial layer. These P-regions may be used as an emitter or emitters for the PNP output power transistor, emitters and collectors of lateral PNP transistors, and resistors. This is accomplished in a manner known well by those skilled in the art.

However, there are at least three situations where the substrate would inject unwanted current into the epitaxial layer to be collected by the P-regions which may provide positive feedback to the circuit output. This positive feedback attempts to drive the substrate to a higher voltage relative to the epitaxial layer, thus injecting more current from the substrate into the epitaxial layer, creating a latch condition. Additionally, in analog circuitry, the unwanted substrate injected currents can cause circuit imbalances and major errors in analog signal paths even if a latch condition does not occur.

One example exists when the P-type substrate (circuit output) is high (at or near $V_{CC}$) and the epitaxial layer is down one $V_{BE}$ voltage because it contains a lateral PNP transistor in a conductive condition. A second example exists when the substrate is at a high voltage level and one region of the epitaxial layer is pulled down one $V_{BE}$ due to lateral NPN action from adjacent epitaxial layer regions. In other words, an NPN transistor is formed by two adjacent N-type epitaxial layer regions and the P-substrate. A third example exists when the substrate voltage is above $V_{CC}$ due to transients on the circuit output. Under any of these examples, the substrate injects current into the epitaxial layer and any P-region diffused in the epitaxial layer may become a collector of that current.

Thus, a need exists for a method of eliminating circuit latch-up and analog signal errors in integrated circuits that comprise a substrate as the collector of a PNP power output transistor.

SUMMARY OF THE INVENTION

Accordingly, it is an object of the present invention to provide an improved power integrated circuit chip configuration.

Another object of the present invention is to provide a method for eliminating latch-up of output of BIMOS circuits.

Yet another object of the present invention is to provide a method for eliminating analog signal errors in circuitry of power integrated circuit chips.

Still another object of the present invention is to provide a method of eliminating latch-up or analog circuit errors caused by injection of substrate current in an operating circuit.

Yet a further object of the present invention is to provide a method of generating analog signals created by injection of current from the substrate to circuitry of power integrted circuit chips.

In carrying out the above and other objects of the present invention in one form, there is provided a circuit monolithically integrated in a vertical structure having a P-type substrate serving as a collector of a vertical PNP transistor and a first N-type epitaxial region overlying the substrate and serving as a base of the vertical PNP transistor. A first P-type region is diffused in a second N-type epitaxial region and collects a first current injected into the second epitaxial region from the substrate when the substrate rises to $V_{CC}$. This first current is applied to the circuit as feedback to compensate for a second current collected from the substrate by a second P-type region diffused in a third N-type epitaxial region. The first P-type region, for example, may be an enlarged collector area of a lateral transistor, contiguous to a P-type resistor without substantially increasing the resistance value, or an isolated P-type region.

The above and other objects, features, and advantages of the present invention will be better understood from the following detailed description taken in conjunction with the accompanying drawings.

BRIEF DESCRIPTION OF THE DRAWINGS

FIG. 1 illustrates in schematic form a circuit including the present invention.

FIG. 2 illustrates a top plan view of an integrated circuit die layout of one transistor of the present invention.

FIG. 3 illustrates a top plan view of an integrated circuit die showing another transistor of the present invention.

FIG. 4 illustrates in cross-section a vertical PNP transistor in addition to the cross-section of the transistors illustrated in FIGS. 2 and 3.

DETAILED DECRIPTION OF THE INVENTION

Referring to FIG. 1, a thermal shut-down circuit is shown that illustrates the analog circuit error problem that exists in power BIMOS circuits which utilizes BIMOS control circuits and a vertical output PNP power transistor, and the solution given by the present invention. This circuit is disclosed in application Ser. No. 582,358 filed concurrently with this application. The thermal shut-down circuit is suitable to be fabricated in monolithic integrated circuit form. Vertical PNP transistor 5 has a base connected to control circuit 6, a collector connected to output terminal 7, and an emitter connected to supply voltage terminal 12. PNP transistor 5 is resident on the same integrated circuit as the remaining circuit of FIG. 1 and has its collector formed by a substrate of the integrated circuit. PNP transistor 11 has an emitter coupled to supply voltage terminal 12 by resistor 13. PNP transistor 14 has an emitter coupled to supply voltage terminal 12 by resistor 15. Transistor 11 is scaled in a manner known to those skilled in the art so that it will have a lower emitter current density than transistor 14. For example, the emitter area of transistor 11 may be four times the emitter area of transistor 14. PNP transistor 16 has an emitter connected to supply voltage terminal 12 and both its base and collector coupled to supply voltage terminal 17 by current source 18. The bases of transistors 11, 14, 16 are interconnected. Transistor 16 establishes a current that is mirrored by transistors 11, 14.

NMOS transistor 19 has a source connected to supply voltage terminal 17 and a drain connected to the collector of transistor 14. NMOS transistor 21 has a source connected to supply voltage terminal 17 and a drain connected to the collector of transistor 11. The gates of transistors 19, 21 are both connected to the collector of transistor 14. Transistors 19, 21 function as a current mirror, thereby insuring that transistors 11, 14 carry identical currents when the circuit is in an equilibrium condition.

Output PNP transistor 22 has an emitter coupled to supply voltage terminal 12 by resistor 23, a collector connected to thermal shut-down signal terminal 24, and a base coupled to the emitter of transistor 11 by resistor 25. DMOS transistor 26 has a drain connected to the base of transistor 22, a gate connected to the collector of transistor 11, and a source connected to controlled current reference terminal 28 and both the gate and drain of NMOS transistor 27. The source of transistor 27 is connected to supply voltage terminal 17. Transistor 27 functions as a diode and provides a bias level for the controlled current reference signal on terminal 28.

NMOS transistor 29 has a drain connected to terminal 24, a source connected to supply voltage terminal 17, and a gate connected to the gates of transistors 19, 21.

Since resistors 13 and 15 are substantially equal in value and transistor 11 is scaled to some multiple value, n, greater than transistor 14 and if the mirror consisting of NMOS transistors 19 and 21 requires the collector current of transistor 14 and 11 to be equal, then the emitter of transistor 11 must be at a lower potential than that of transistor 14. This lower potential is achieved by conducting an additional current, I, through resistor 13. This current, I, is equal to $$\frac{KT}{qR_{13}} \ln n$$

where K is Boltzman's constant, T is absolute temperature, q is the charge of an electron, and $R_{13}$ is the ohmic value of resistor 13. This additional current is forced by negative feedback, from the collector of transistor 11, to flow through resistor 25 and transistors 26 and 27. The voltage at the drain of transistor 26 may be used for thermal sensing and shutdown purposes.

Referring to FIGS. 2 and 3, the integrated circuit die layout of transistors 11, 14 respectively, are illustrated. Transistor 11 has a base region 31 comprising an N-type epitaxial layer overlying a P-type substrate (not shown). A P-type collector region 32 and a plurality of P-type emitter regions 33 are diffused into the epitaxial layer 31. This multi-emitter structure is well known to those skilled in the art.

Referring to FIG. 3, transistor 14 has a base region 34 comprising an N-type epitaxial layer. A P-type collector region 35 and a single P-type emitter region 36 is diffused into the epitaxial layer 34. Transistor 14 may have any number of emitter regions 36, even though only one is shown. Transistor 11 is understood to have multiple emitter regions to that of transistor 14.

Referring to FIG. 4, the vertical PNP transistor comprises substrate 37 (collector), N-type epitaxial region 38 (base) overlying substrate 37, and P-type region 39 (emitter). N-type epitaxial region 31 overlies substrate 37 and is electrically isolated from N-type epitaxial region 38 by diffused isolation 41 which extends into substrate 37. N-type epitaxial region 34 overlies substrate 37 and is electrically isolated from N-type epitaxial regions 38 by diffused isolation 42 which extends into substrate 37. Alternate isolation techniques, e.g., a groove etched through the thickness of N-type epitaxial regions 31, 34, 38 may be used. Collector regions 32 and 35 and emitter regions 33, 36 are diffused into N-type epitaxial region 31.

Collector regions 32 and 35 are shown to have a box matrix configuration. However, any type of configuration would be sufficient as long as the collectors are substantially identical in area. These collector regions 32 and 35 would then equally collect current injected into epitaxial layers 31, 34 by the P-type substrate when the voltage on the substrate rises one $V_{BE}$ above epitaxial regions 31, 34. The following analysis illustrates that any current injected into the epitaxial layer from the P-substrate will have no effect on the thermal shut-down circuit illustrated in FIG. 1.

With the circuit of FIG. 1 in equilibrium, the lateral collector currents of transistors 11, 14 through transistors 21, 19, respectively, are forced to be substantially equal. The substrate currents collected by collector regions 32, 35 of transistors 11, 14 respectively, will also be equal due to their identical area, even though of unknown value. The current mirror action of transistors 19, 21 will then cancel the effects of the equally collected substrate currents so that no error is introduced into the $\Delta V_{BE}$ voltage.

In a like manner, it could be seen that any P region such as resistors 13 and 15 may collect current from the substrate and cause analog circuit errors. As shown in the previous argument, if resistors 13 and 15 collect substantially equal currents, no analog error occurs.

Additionally, it may be desired to produce analog errors or signals of given polarity. For example, it may be desirable that resistors 13 and 15 not collect identical current so as to produce a signal of given polarity at the output when the substrate is at or near the supply voltage. This signal may be developed by making the collection regions, e.g., resistors 13, 15, of different sizes without changing their ohmic value. Therefore, an analog signal may be produced by providing a P region in an epitaxial region which is one $V_{BE}$ below supply. This P region then collects current from the substrate when the substrate is at or near the supply voltage. The phase to the output of this analog signal is then dependent on its location in the circuit topology. In other words, the collecting region contains an analog signal which may be used to control the output.

By now it should be appreciated that there has been provided a method of eliminating analog circuit errors and circuit latch-up in a power integrated circuit comprising a substrate as the collector of a vertical output power PNP. An example of the circuit includes a first lateral PNP transistor having a plurality of emitter regions diffused in a first portion of the epitaxial layer, and a collector region diffused in the first portion. A second lateral transistor has a single emitter region diffused in a second portion of the epitaxial layer, and a collector region substantially equal in area to the collector region of the first lateral transistor diffused in the second portion of the epitaxial layer. Therefore, the collectors of the first and second transistor collect substantially equal currents injected from the P-type substrate and thereby, circuit balance is maintained.

We claim:

1. A circuit resident on an integrated circuit having a P-type substrate wherein the substrate forms at least a collector of a vertical PNP transistor, said substrate further including at least a first and a second portion, said circuit comprising:
    a first supply voltage terminal;
    a second supply voltage terminal;
    a first transistor conducting a first current and having an emitter, a base and a collector, said collector coupled to said second supply voltage terminal;
    a second transistor conducting a second current substantially the same as said first current and having an emitter, a base and a collector, said collector coupled to said second supply voltage terminal, said emitter of said second transistor scaled larger than said emitter of said first transistor for providing a voltage difference between said emitters of said first and second transistors, said collector of said first and second transistors scaled substantially the same, whereas any undesirable current injected into said collectors of said first and second transistors from said substrate will be substantially the same;
    first means coupled to said bases of said first and second transistors for biasing said first and second transistors;
    second means coupled between said first supply voltage terminal and said emitters of said first and second transistors for establishing said first current substantially the same as said second current; and
    third means coupled between said first supply voltage terminal and said second supply voltage terminal and coupled to said second means for supplying an output.

2. The circuit according to claim 1 wherein said first transistor comprises a first N-type epitaxial region overlying said first portion of said substrate and forming said base of said first transistor, said first N-type epitaxial region having a first and second portion, a first P-type region diffused in said first portion of said first N-type epitaxial region and forming said collector of said first transistor, a second P-type region diffused in said second portion of said first N-type epitaxial region and forming said emitter of said first transistor.

3. The circuit according to claim 2 wherein said second transistor comprises a base formed from said first N-type epitaxial region, said first N-type epitaxial region having a third and fourth portion, a third P-type region diffused in said third portion of said first N-type epitaxial region and forming said collector of said second transistor, a plurality of P-type regions diffused in said fourth portion of said first N-type epitaxial region and forming said emitter of said second transistor.

4. The circuit according to claim 2 wherein said second transistor comprises a second N-type epitaxial region overlying said second portion of said substrate and forming said base of said second transistor, said second N-type epitaxial region having a first and second portion, a third P-type region diffused in said first portion of said second N-type epitaxial region and forming said collector of said second transistor, a plurality of P-type regions diffused in said second portion of said second N-type epitaxial region and forming said emitter of said second transistor.

5. A circuit resident on an integrated circuit having a P-type substrate wherein the substrate forms at least a collector of a vertical PNP transistor, said circuit having a first supply voltage terminal, a second supply voltage terminal, and an output terminal, said circuit comprising:
    a first transistor having a collector coupled to said second supply voltage terminal;
    a second transistor having a collector coupled to said second supply voltage terminal, said second transistor having an emitter scaled to conduct a larger current than said first transistor, said collectors of said first and second transistors scaled substantially the same, whereas any undesirable current injected into said collectors of said first and second transistors from said substrate will be substantially the same;
    biasing means coupled to a base of both of said first and second transistors for biasing said first and second transistors;
    first resistive means coupled between said first supply voltage terminal and an emitter of said first transistor for conducting a first current;
    second resistive means coupled between said first supply voltage terminal and said emitter of said second transistor for conducting a second current;
    third resistive means having a first terminal coupled to said emitter of said second transistor for conducting a third current;
    current establishing means coupled between a second terminal of said third resistive means and said second supply voltage terminal, and coupled to said collector of said second transistor for establishing said first current substantially the same as said second current;
    a third transistor having a collector coupled to said output terminal, an emitter coupled to said first supply voltage terminal, and a base coupled to said second terminal of said third resistive means; and
    output means coupled between said collector of said third transistor and said second supply voltage terminal for determining a voltage level at said output terminal.

6. A circuit resident on an integrated circuit having a P-type substrate wherein the substrate forms at least a collector of a vertical PNP transistor, said substrate further including at least a first and a second portion, said circuit comprising:
    a first supply voltage terminal;
    a second supply voltage terminal;
    first means coupled between said first and second supply voltage terminals for conducting a first current, wherein said first current includes a second current injected into said first means from said substrate;
    second means coupled to said first means for collecting a third current injected from said substrate, whereas said third current is applied to said first current to compensate for said second current injected into said first means; and
    fourth means coupled between said first supply voltage terminal and said second supply voltage terminal and coupled to said first means for supplying an output.

* * * * *